United States Patent [19]
Tsuji et al.

[11] 3,837,859
[45] Sept. 24, 1974

[54] LIGHT-SENSITIVE COMPOSITION CONTAINING XYLENE RESIN

[75] Inventors: Nobuo Tsuji; Eiichi Hasegawa, both of Ashigara, Japan

[73] Assignee: Fuji Photo Film Co., Ltd., Kanagawa, Japan

[22] Filed: May 30, 1972

[21] Appl. No.: 257,621

[30] Foreign Application Priority Data
May 28, 1971 Japan ................................ 46-36831

[52] U.S. Cl. ........................ 96/91 N, 96/33, 96/35.1, 96/115 R, 204/159.14
[51] Int. Cl. ............................ G03c 1/68, G03c 1/70
[58] Field of Search ............... 96/35.1, 115 R, 91 N; 204/159.14

[56] References Cited

UNITED STATES PATENTS

| | | | |
|---|---|---|---|
| 3,481,738 | 12/1969 | Eissler | 96/115 R |
| 3,493,380 | 5/1970 | Rauner et al. | 96/115 R |
| 3,647,470 | 3/1972 | Tsuda | 96/115 R |

*Primary Examiner*—Ronald H. Smith
*Attorney, Agent, or Firm*—Sughrue, Rothwell, Mion, Zinn & Macpeak

[57] ABSTRACT

A light-sensitive composition comprising a light-sensitive resin selected from the group consisting of a cinnamic acid resin, a cinnamylidene acetate resin and a cyclized rubber resin, and a xylene resin is disclosed.

11 Claims, No Drawings

LIGHT-SENSITIVE COMPOSITION CONTAINING XYLENE RESIN

BACKGROUND OF THE INVENTION

1. Field of the Invention

This invention relates to a light-sensitive composition comprising a light-sensitive resin selected from the group consisting of a cinnamic acid resin, a cinnamylidene acetate resin and a cyclized rubber resin, and a xylene resin.

2. Description of the Prior Art

Polyvinylcinnamate and derivatives thereof having various substituents on the phenyl group thereof, polyvinylcinnamylidene acetate and cyclized rubbers are known as light-sensitive compounds. Illustrative such compounds are disclosed in, for example, Japanese Patent Publication No. 1492/63, and U.S. Pat. Nos. 2,610,120, 3,257,664 and 2,940,853. Of these compounds, polyvinylcinnamate is known to have excellent characteristics; i.e., it can be highly sensitized with a sensitizer and the resulting image is sharp and possesses a high resolving power, and it also exhibits a superior resistance against various chemical agents. Because of its outstanding characteristics, polyvinylcinnamate is widely used as resist materials for print wirings, integrated circuits, chemical milling and the like. However, the most serious disadvantage of polyvinylcinnamate is that it is too expensive. Although some improved processes for the synthesis of polyvinylcinnamate have been proposed, polyvinylcinnamate is still quite expensive in comparison with other synthetic compounds commonly employed such purposes. In order to eliminate the above disadvantage associated with the use of polyvinylcinnamate, the incorporation of a phenol resin into polyvinylcinnamate was proposed (Japanese Patent Publication No. 8498/70), but it has been found that, when the phenol resin used in the above Japanese Patent Publication which is available from Hitachi Chemical Co., Ltd. under the name of Hitanol 2181 S was incorporated into polyvinylcinnamate, the resulting product becomes opaque where the proportion of the phenol resin exceeds 30 percent by weight of the total composition.

An object of this invention is therefore to provide a light-sensitive composition at low cost without deterioration in characteristics of a light-sensitive substance such as polyvinylcinnamate. The present inventor did various research and found that a certain xylene resin can be admixed easily with polyvinylcinnamate and yet the polyvinylcinnamate is not lowered in its properties. On the basis of such research, the present inventors accomplished the present invention.

SUMMARY OF THE INVENTION

Accordingly, this invention provides a light-sensitive composition comprising a light-sensitive resin and a xylene resin, the light-sensitive resin being selected from the group consisting of cinnamic acid resins, cinnamylidene acetate resins and cyclized rubber resins.

DETAILED DESCRIPTION OF THE INVENTION

The xylene resin used in the present invention includes a xylene-formaldehyde resin obtained by condensing xylene, in particular, m-xylene with formaldehyde, as well as a modified xylene resin obtained by reacting this xylene-formaldehyde resin with other organic compounds by taking advantage of the reactivity of the xylene-formaldehyde resin. These xylene resins are well-known compounds. For example, they can be synthesized as follows: 1 mole of m-xylene, 1 mole of formaldehyde and 0.37 mole of concentrated sulfuric acid are heated on a steam bath with stirring. After heating the mixture for 4 hours, 500 ml of toluene is added to dissolve the solid substances. The reaction mixture is washed successively with water and 5 percent aqueous sodium hydroxide, dried over calcium chloride and then evaporated on a steam bath under a reduced pressure of 10 mm Hg to remove the toluene and unreacted m-xylene, thereby leaving a yellow viscous liquid. The thus obtained product is the desired resin and usually has a molecular weight of less than 500, for example, from about 200 to about 500, preferably from about 400 to about 500.

As described above, various modified xylene resins can be formed from the xylene-formaldehyde resin by reaction with other compounds by taking advantage of the reactivity of an ether bond or a methylol group in the xylene-formaldehyde resin molecule. Such modified xylene resins include, for example, a thermoplastic phenol-modified xylene resin obtainable by the reaction with a bifunctional phenol, for example, a p-alkyl substituted phenol such as p-methyl-phenol, p-(t-butyl)-phenol, etc, a thermosetting phenol-modified xylene resin obtainable by the reaction with trifunctional phenol such as phenol, an esterfied xylene resin obtainable by the reaction with a carboxylic acid such as acetic acid, propionic acid, etc., or an acid anhydride such as acetic acid anhydride etc, an amine-modified xylene resin obtainable by the reaction with an amine, for example, alkyl amines such as ethyl amine, hexyl amine etc, an isocyanate-modified xylene resin obtainable by the reaction with an isocyanate such as toluene-diisocyanate, a rosin-modified xylene resin and the like. The amount of these modifying materials can vary but generally from about 5 to 50 percent by weight, preferably from about 10 to 30 percent by weight is suitable. Some of these xylene resins are commercially available, for example, under the trade name of Nikanol from Japan Gas-Chemical Company, Inc., and are very inexpensive in comparison with that of polyvinylcinnamate. Industrially the light-sensitive compositions in which one of these xylene resins is incorporated can be therefore produced economically in comparison with those consisting of polyvinylcinnamate alone.

Moreover, it was found that the transparency of the resulting compositions remains even if the light-sensitive composition of this invention contains the xylene resin in an amount of about 1.5 times by weight that of the cinnamic acid resin, this amount of the xylene resin corresponding to approximately 60 percent of the total composition and as low as 5 percent by weight of the xylene resin is suitable. Preferably from about 20 to 40 percent by weight is used. The xylene resin exhibits excellent acid — and alkali — resistance as well as water — and moisture — resistance which is superior to phenol resins, and also has an adhesion to metals such as copper, aluminum, zinc or the like and to glass. In addition, in accordance with the present invention, the properties of the light-sensitive composition can be varied by incorporating different types of xylene resins into the light-sensitive material since a wide variety of modified resins can be prepared as compared with phenol resins. Accordingly, the light-sensitive composition of this invention exhibits excellent properties as resist materials for lithographic plates, a relief printing plates, print wiring, a name plate, chemical milling and the like.

The xylene resin used in the present invention can be combined with cinnamic acid type light-sensitive resins, a representative of which is polyvinylcinnamate, including those having substituents on the phenyl groups of the cinnamoyl moiety (e.g., ortho-nitro substituted, ortho-chloro substituted, etc.) as well as with other well-known light-sensitive resins to obtain significantly effective light-sensitive compositions. The degree of polymerization of the cinnamic acid resin can vary but a degree of polymerization of from 1,000 to 2,000 generally is suitable. For example, the xylene resin may be employed in combination with a light-sensitive resin of the type such as those in which a natural rubber, a synthetic rubber or a cyclized rubber and an organic azide compound are dissolved in an organic solvent, or in combination with a light-sensitive polyvinylcinnamylidene acetate resin. The light-sensitive resins which can be used in the present invention have been disclosed in a number of patents including those described above and some of these resins are commercially available (see U.S. Pat. Nos. 2,848,328 and 2,940,853).

The present invention will now be illustrated in greater detail by reference to the following examples, but these examples are not to be construed as limiting the scope of this invention.

EXAMPLE 1

A light-sensitive solution was prepared from the following components:

| | |
|---|---|
| Polyvinylcinnamate | 25 g |
| 1,2-Benzanthraquinone | 0.3 g |
| Methyl Ethyl Ketone | 150 ml |
| Methyl Cellosolve Acetate | 150 ml |

A portion of the solution thus obtained was dropped on the surface of a copper base plate for print wiring placed on a whirler rotating at a rate of 100 r.p.m., and the base plate was coated uniformly. The coated plate was then dried at a temperature of 80°C for 10 minutes to form a light-sensitive layer having a thickness of 20 microns. The coated plate was then exposed for 3 minutes to the light from a high-pressure mercury lamp of 500 W through an original composed of a silver halide film on which a wiring pattern was marked. The exposed plate was then developed for one minutes with methyl ethyl ketone. Additional light-sensitive solutions were prepared using the above-prepared light-sensitive solution of further adding 5 g (17%), 10 g (29%), 15 g (38%) and 20 g (45%), respectively, of Nikanol-H, a m-xylene-formaldehyde resin available from Japan Gas-Chemical Company, Inc. Nikanol-H as a viscous material was easily dissolved in the above-described solution of polyvinylcinnamate to give clear solutions having almost the same transparency as that of a solution containing no Nikanol-H. The resulting light-sensitive solutions containing Nikanol-H were applied to the surface of copper base plates for print wiring under the same conditions as above and dried. It was found that the resulting four light-sensitive layers were still clear and that the polyvinylcinnamate and the Nikanol-H were admixed satisfactorily even in this stage. Further, the sensitivity of the layer which does not contain Nikanol-H and those containing 17 percent, 29 percent, 38 percent and 45 percent Nikanol-H was found to be 8, 8, 8, 8 and 7, respectively, in using the grey scale number, indicating that only one composition, the layer containing 45 percent Nikanol-H, was affected and that it was affected to the extent of only one scale unit. Also, the adhesion to the copper base plate was found to increase as the proportion of Nikanol-H increased and no swelling was found in each case when developed with methyl ethyl ketone. This indicates that no objectionable change occurs in the developer resistance.

The material for a print wiring obtained from the above light-sensitive solutions to which Nikanol-H was added in an amount of 0 to 45 percent were then etched with an aqueous solution of ferric chloride (40° Be) at a temperature of 40°C for 5 minutes, and, after being dried, the light-sensitive resist layer was removed by treating with dichloroethylene to give the desired print wiring plates. In such treatment, it was found that the removal of the resist can be effected more easily as the amount of Nikanol-H added increases.

The above experimental results indicate that the light-sensitive compositions can be prepared at a low cost by combining the xylene-formaldehyde resin with the polyvinylcinnamate resin without any deleterious effect on the quality of the desired compositions.

EXAMPLE 2

Comparative results were obtained by using Nikanol-HP 100 in place of the Nikanol-H employed in Example 1. Nikanol-HP 100 used in this example is a light yellow solid having a softening point of 120°C and an acid value less than 30 and is obtained by partially reacting a xylene-formaldehyde resin with a p-alkylphenol.

EXAMPLE 3

A mixed solution similar to that described in Example 1 was prepared by using Nikanol-B-640 (available from Japan Gas Chemical Company, Inc.) in place of the Nikanol-H used in Example 1. Nikanol B-640 used in this example is a red-brown liquid substance which is obtained by partially reacting the xylene-formaldehyde resin with an amine. The thus obtained clear mixed solution was sprayed on a zinc plate for relief printing and the resulting coating was then dried. The light-sensitive layer thus obtained was transparent and had a thickness of 20 microns. No phase-separation as well as other objectionable changes were found in the layer. The coated plate was then contacted with a dot original of silver halide, exposed to the light from a carbon arc lamp and then developed with trichloroethylene. The plate was finally etched with nitric acid to give the desired relief printing plate.

EXAMPLE 4

A light-sensitive solution was prepared from the following components:

| | | |
|---|---|---|
| Cyclized Rubber* | 10 | g |
| Xylene | 100 | g |
| Nikanol-H | 10 | g |
| 4,4'-Diazidostilbene | 0.4 | g |

* Marketed by Chemische Werke Albert, W. Germany under the trademark — Alpex 450J.

The resulting clear solution was applied to the surface of a copper base plate and worked up on a similar manner to that of Example 1 to obtain a sharp printing plate.

EXAMPLE 5

| | | |
|---|---|---|
| Polyvinylcinnamylidene Acetate | 10 | g |
| Methyl Cellosolve | 100 | g |
| Nikanol-P 100 | 15 | g |
| N-Phenylthioacridone | 0.3 | g |

Nikanol-P 100 is a trade name of the Japan Gas-Chemical Company, Inc. and is obtainable by partially reacting a xylene-formaldehyde resin with phenol. The solution having the above composition was clear and homogenous and was then applied to the surface of an aluminum plate which had previously been anodically oxidized, and the coated plate was dried at a temperature of about 60°C for 30 minutes. The light-sensitive layer was still clear even at this stage. The sensitive layer was then imagewise exposed to the light from a carbon arc lamp and developed with methyl cellosolve to give a photo-lithographic plate having a sharp photopolymerization image.

EXAMPLE 6

Nikanol AM-120 (available from the Japan Gas-Chemical Company, Inc.) was used in an equivalent amount in place of the Nikanol-P 100 used in Example 5. Nikanol AM-120 is one of the so-called rosin-modified xylene-formaldehyde resins which is obtained by adding rosin to the xylene-formaldehyde resin. To the solution was added 0.1 g of carbon black having a particle size of 30 millimicrons and the mixture was thoroughly stirred to disperse the carbon black uniformly. The resulting dispersion was applied to the surface of a glass plate to a thickness of 20 microns, and after being dried, the coated plate was worked up in the same manner as Example 5 to obtain a name plate having sharp black letters.

While the invention has been described in detail and in terms of specific embodiments thereof, it will be apparent that various changes and modifications can be made therein without departing from the spirit and scope thereof.

What is claimed is:

1. A light-sensitive composition comprising 20 to 40 percent by weight of the composition of a xylene-formaldehyde resin and comprising a light-sensitive resin selected from the group consisting of a resin containing the cinnamoyl moiety, a polyvinylcinnamylidene acetate resin and a cyclized rubber resin.

2. The composition according to claim 1, wherein said xylene-formaldehyde resin is a modified xylene-formaldehyde resin.

3. The composition according to claim 2, wherein said modified xylene-formaldehyde resin is a phenol-modified xylene-formaldehyde resin.

4. The composition according to claim 2, wherein said modified xylene-formaldehyde resin is an esterified xylene-formaldehyde resin.

5. The composition according to claim 2, wherein said modified xylene-formaldehyde resin is an amine-modified xylene-formaldehyde resin.

6. The composition according to claim 2, wherein said modified xylene-formaldehyde resin is an isocyanate-modified xylene-formaldehyde resin.

7. The composition according to claim 2, wherein said modified xylene-formaldehyde resin is a rosin-modified xylene-formaldehyde resin.

8. The composition according to claim 1, wherein said light-sensitive resin is polyvinylcinnamate.

9. The composition according to claim 1, wherein said light-sensitive resin is polyvinylcinnamylidene acetate.

10. The composition according to claim 1, wherein said light-sensitive resin comprises a cyclized rubber and an organic azide.

11. The composition according to claim 1, wherein said xylene-formaldehyde resin is present in an amount less than 1.5 times by weight the amount of said light-sensitive resin.

* * * * *